(12) United States Patent
Eddison et al.

(10) Patent No.: US 10,694,633 B2
(45) Date of Patent: Jun. 23, 2020

(54) MOTOR CONTROLLER AND METHOD FOR ASSEMBLING THE SAME

(71) Applicant: REGAL BELOIT AMERICA, INC., Beloit, WI (US)

(72) Inventors: Maung Eddison, Fort Wayne, IN (US); Zachary Joseph Stauffer, Fort Wayne, IN (US); Mark A. Swiger, New Bremen, OH (US); Luis D. Morales, Fort Wayne, IN (US)

(73) Assignee: REGAL BELOIT AMERICA, INC., Beloit, WI (US)

( * ) Notice: Subject to any disclaimer, the term of this patent is extended or adjusted under 35 U.S.C. 154(b) by 178 days.

(21) Appl. No.: 15/814,005

(22) Filed: Nov. 15, 2017

(65) Prior Publication Data

US 2019/0150309 A1    May 16, 2019

(51) Int. Cl.
| | |
|---|---|
| *H02K 15/14* | (2006.01) |
| *H05K 5/06* | (2006.01) |
| *H02K 5/04* | (2006.01) |
| *H02K 11/33* | (2016.01) |
| *H02K 9/22* | (2006.01) |
| *H02K 5/22* | (2006.01) |
| *H02K 1/27* | (2006.01) |

(52) U.S. Cl.
CPC .............. *H05K 5/064* (2013.01); *H02K 5/04* (2013.01); *H02K 11/33* (2016.01); *H02K 15/14* (2013.01); *H02K 1/278* (2013.01); *H02K 5/22* (2013.01); *H02K 9/22* (2013.01); *H02K 2211/03* (2013.01); *H05K 2203/1377* (2013.01)

(58) Field of Classification Search
CPC .. H05K 5/06; H05K 2203/1377; H02K 15/14; H02K 5/04; H02K 5/22; H02K 9/22; H02K 2211/03; H02K 1/278
See application file for complete search history.

(56) References Cited

U.S. PATENT DOCUMENTS

| | | | |
|---|---|---|---|
| 8,324,769 B2 | 12/2012 | Clendenen | |
| 8,796,377 B2 | 8/2014 | Tonniessen et al. | |
| 2002/0190396 A1* | 12/2002 | Brand | H01L 21/565 257/787 |
| 2008/0290763 A1* | 11/2008 | Oohashi | H02K 19/365 310/68 D |
| 2011/0068661 A1* | 3/2011 | Clendenen | H02K 11/33 310/68 D |
| 2012/0113633 A1* | 5/2012 | Bowen | F21V 3/04 362/235 |
| 2013/0207491 A1* | 8/2013 | Hatfield | H02K 3/522 310/50 |

(Continued)

*Primary Examiner* — Naishadh N Desai
(74) *Attorney, Agent, or Firm* — Armstrong Teasdale LLP

(57) ABSTRACT

A method of encapsulating a printed circuit board of a motor controller with a potting material includes inserting the printed circuit board into a recess formed in a base portion of an encapsulation assembly such that a bottom surface of the printed circuit board is spaced from a surface of the recess. The method also includes coupling a cover portion of the encapsulation assembly to the base portion to define a cavity therebetween. The method further includes injecting the potting material into the cavity through at least one injection port defined in at least one of the base portion and the cover portion such that the printed circuit board is at least partially coated in the potting material.

20 Claims, 8 Drawing Sheets

(56) References Cited

U.S. PATENT DOCUMENTS

2014/0132123 A1* 5/2014 Berney ............... G01R 33/07
                                                   310/68 B
2016/0099627 A1* 4/2016 Johnson ............... H02K 5/18
                                                   310/68 D

* cited by examiner

MOTOR CONTROLLER AND METHOD FOR ASSEMBLING THE SAME

BACKGROUND

The field of the disclosure relates generally to electric motors, and more specifically, to the assembly of an electric motor controller configured to be positioned at least partially within an electric motor housing.

Environmental protection is critical to manufacturing robust motor controls for electric motors. There are two main methods to protect the electronics of the motor controller from environmental stresses, such as extreme temperatures and exposure to moisture. The primary protections methods include conformal coating and a "brick" potting/epoxy encapsulation. Conformal coating includes adding a thin layer of either silicone or acrylic material to the surface of a printed circuit board (PCB) and/or its components. While conformal coating is the lowest cost solution, it only provides minimal environmental protection.

Brick encapsulation includes surrounding the PCB in a thick layer of an epoxy potting material. This method provides the greatest amount of environmental protection, however, the manufacturing cost are greater than conformal coating because of the large quantities of epoxy material used. For example, in the case of multi-board designs, the potting material may be up to several inches in height to cover the entirety of the boards. Additionally, the large amount of dense epoxy undesirably increases the weight of the motor controller, and the electric motor assembly overall.

BRIEF DESCRIPTION

In one aspect, a method of encapsulating a printed circuit board of a motor controller with a potting material is provided. The method includes inserting the printed circuit board into a recess formed in a base portion of an encapsulation assembly such that a bottom surface of the printed circuit board is spaced from a surface of the recess. The method also includes coupling a cover portion of the encapsulation assembly to the base portion to define a cavity therebetween. The method further includes injecting the potting material into the cavity through at least one injection port defined in at least one of the base portion and the cover portion such that the printed circuit board is at least partially coated in the potting material.

In another aspect, an encapsulation assembly for use in coating a printed circuit board of a motor controller with a potting material is provided. The encapsulation assembly includes a base portion comprising at least one recess defined therein. The at least one recess includes a recess surface configured to be spaced from a bottom surface of the printed circuit board. The encapsulation assembly also includes a cover portion configured to be coupled to the base portion such that the base portion and the cover portion define a cavity therebetween configured to receive the printed circuit board therein. The encapsulation assembly includes at least one injection port defined in at least one of the base portion and the cover portion, wherein the at least one injection port facilitates injection of the potting material into the cavity. The encapsulation assembly also includes a plurality of isolation structures coupled to at least one of the base portion and the cover portion. The isolation structures prevent the potting material from contacting a plurality of predetermined portions of the printed circuit board.

In yet another aspect, a motor controller for use with an electric motor is provided. The motor controller includes at least one printed circuit board comprising a top surface and a bottom surface. The motor controller also includes a potting material coupled to the printed circuit board. The potting material includes a first thickness extending from the top surface and a second thickness extending from the bottom surface.

Although specific features of various embodiments may be shown in some drawings and not in others, this is for convenience only. Any feature of any drawing may be referenced and/or claimed in combination with any feature of any other drawing.

DETAILED DESCRIPTION

The apparatus and method described below include a motor controller including a layer of potting material that has a predetermined thickness to provide a significant increase in environmental protection over conformal coating protection methods, while also reducing the amount of potting material required compared to known brick encapsulation methods. The method allows an existing motor controller to be potted, with a predefined potting thickness, on both top and bottom, without the need to completely encapsulate the motor controller board within the housing. This provides a substantial reduction in potting material used while also providing the desired level of environmental protection. Additionally, both manufacturing and labor costs and time are reduced because of using less material and because no modifications to the housing are required. Moreover, the apparatus and method described herein provide vibration protection via encapsulation and also provide isolation to various components requiring heat sinking.

Figure 1:
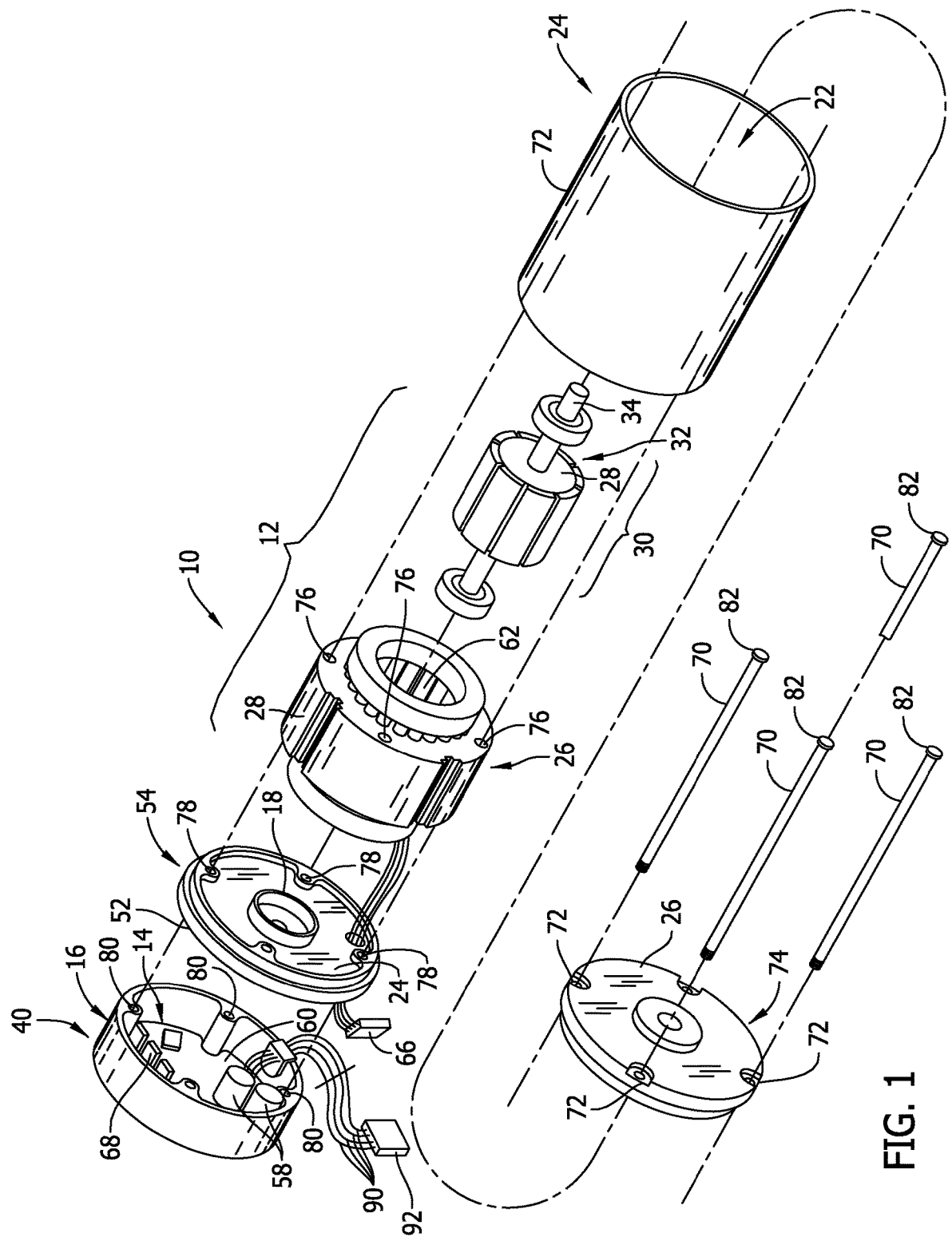
FIG. 1 is an exploded view of an exemplary motor and motor controller assembly.
Figure 2:
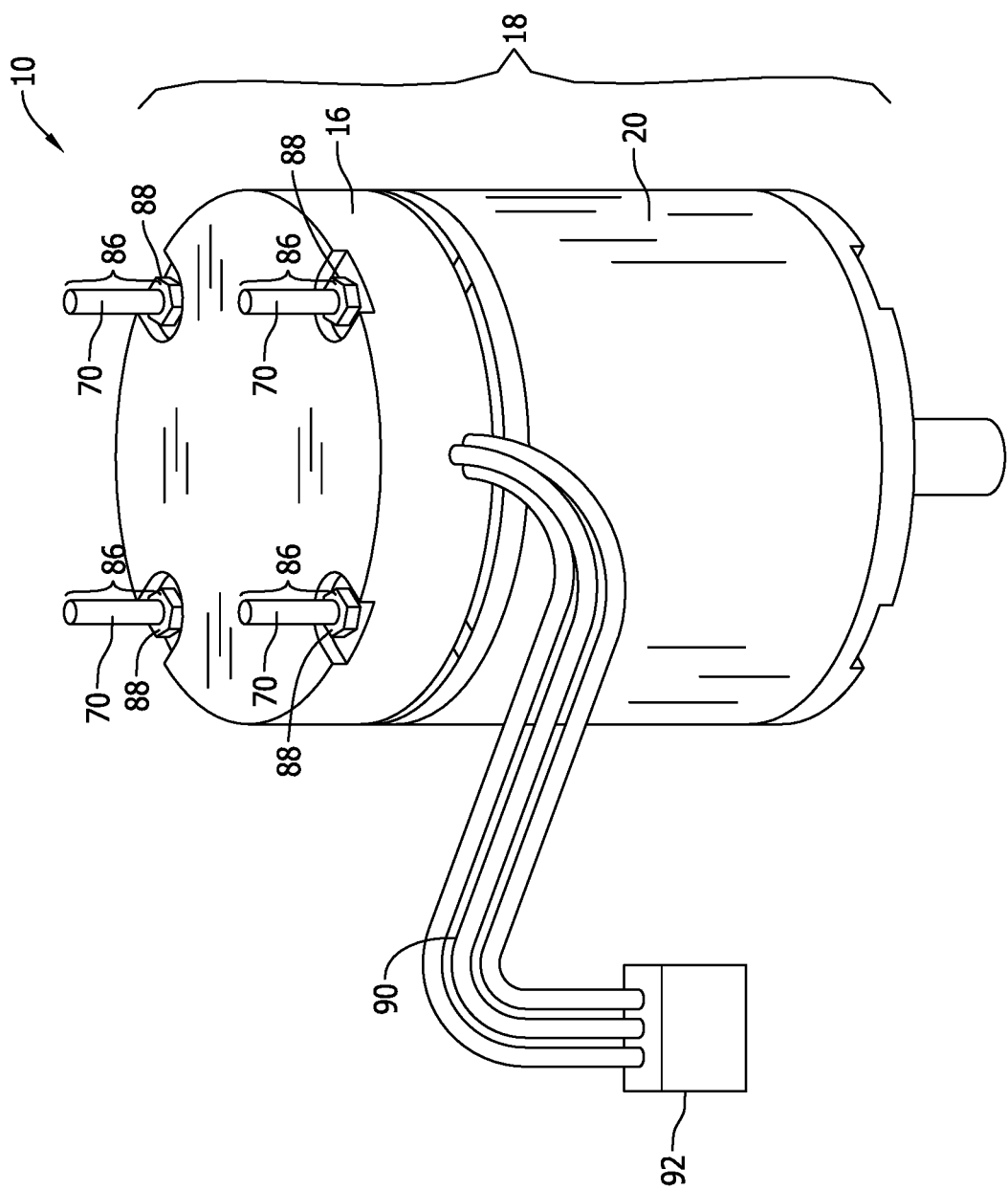
FIG. 2 is a fully assembled view of the motor and motor controller assembly shown in FIG. 1.

FIG. 1 is an exploded view of an integrated induction motor and motor controller assembly 10, also referred to herein as motor assembly 10. FIG. 2 illustrates the fully assembled motor assembly 10. Motor assembly 10 includes an induction motor 12 and a motor control unit 14, also referred to herein as motor controller 14. Motor controller 14 is configured to be positioned at least partially within an end cap 16. A motor assembly housing 18 includes end cap 16 and a housing shell 20. Motor assembly housing 18 defines an interior 22 and an exterior 24 of motor assembly 10 and is configured to at least partially enclose and protect motor assembly 10. Motor 12 includes a stationary assembly 26 including a stator or core 28 and a rotatable assembly 30 including a permanent magnet rotor 32 and a shaft 34. A fan (not shown) or other device to be driven such as means for moving air through an air handling system engages shaft 34. In the exemplary embodiment, motor assembly 10 is included within an air handling system. For example, motor assembly 10 may be coupled to a fan for blowing air over cooling coils and/or coupled to an air conditioning compressor for driving the compressor.

End cap 16 is mounted on a rear portion 40 of motor assembly 10 to enclose motor controller 14 at least partially within end cap 16. Motor controller 14 is positioned adjacent an outer side 52 of a first end member 54. Motor controller 14 includes a plurality of electronic components 58 and a connector (not shown) mounted on a component board 60, for example, a printed circuit board (PCB). Motor controller 14 is connected to winding stages 62 of stationary assembly 26 by interconnecting a winding end turn connector 66 and a motor control unit connector 68. Motor controller 14 applies a voltage to one or more of winding stages 62 at a time for commutating winding stages 62 in a preselected sequence to rotate rotatable assembly 30 about an axis of rotation.

Connecting elements 70, for example, a plurality of bolts, pass through bolt openings 72 in a second end member 74, bolt openings 76 in core 28, bolt openings 78 in first end member 54, and bolt openings 80 in end cap 16. Heads 82 of connecting elements 70 engage the second end member 74. Connecting elements 70 are adapted to urge second end member 74 and end cap 16 toward each other, thereby supporting first end member 54, stationary assembly 26, and rotatable assembly 30 therebetween. Additionally, housing shell 20 may be positioned between first end member 54 and second end member 74 for enclosing and protecting stationary assembly 26 and rotatable assembly 30.

Although described as including induction motor 12, integrated induction motor and motor control unit assembly 10 may include any suitable type of electric motor including, but not limited to, induction motor 12, a brushless direct current (BLDC) motor, an electronically commutated motor (ECM), a brushless alternating current (BLAC) motor, or a stepper motor.

As described above, FIG. 2 illustrates motor assembly 10 in a fully assembled state. Connecting elements 70 pass through second end member 74, stationary assembly 26, first end member 54, and end cap 16. Connecting elements 70 have a portion 86 which projects laterally from end cap 16. Portion 86 is adapted to engage a support structure (not shown) for supporting the motor assembly 10. Connecting elements 70 may be secured in place by placing a nut 88 engaging the threads on each of portions 86 of connecting elements 70. A wiring harness 90 and a connector 92 are utilized to connect motor assembly 10 to an electrical power source.

Figure 3:
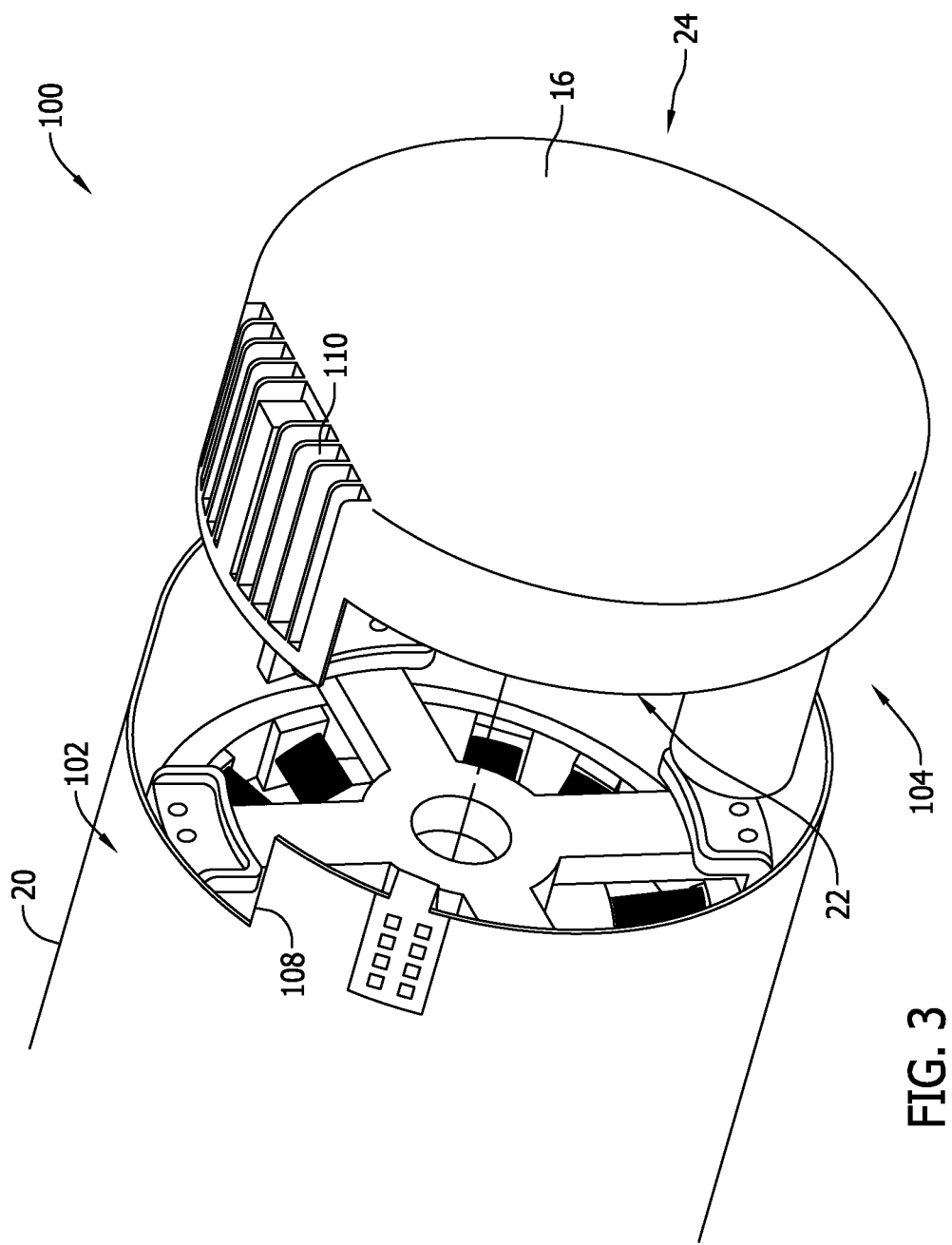
FIG. 3 is a perspective view of an exemplary integrated motor and motor controller assembly.

FIG. 3 is a perspective view of an exemplary integrated motor and motor control unit assembly 100. Components shared between motor assembly 100 and motor assembly 10 (shown in FIG. 1) are identified with the same reference numbers. Motor assembly 100 includes an ECM 102 and an ECM motor controller 104 positioned at least partially within end cap 16. In the exemplary embodiment, motor controller 104 is coupled to a surface (not shown in FIG. 3) of end cap 16, in interior 22 of end cap 16. In the exemplary embodiment, housing shell 20 also includes a slot 108 which engages a heat sink 110 formed in end cap 16.

Figure 4:
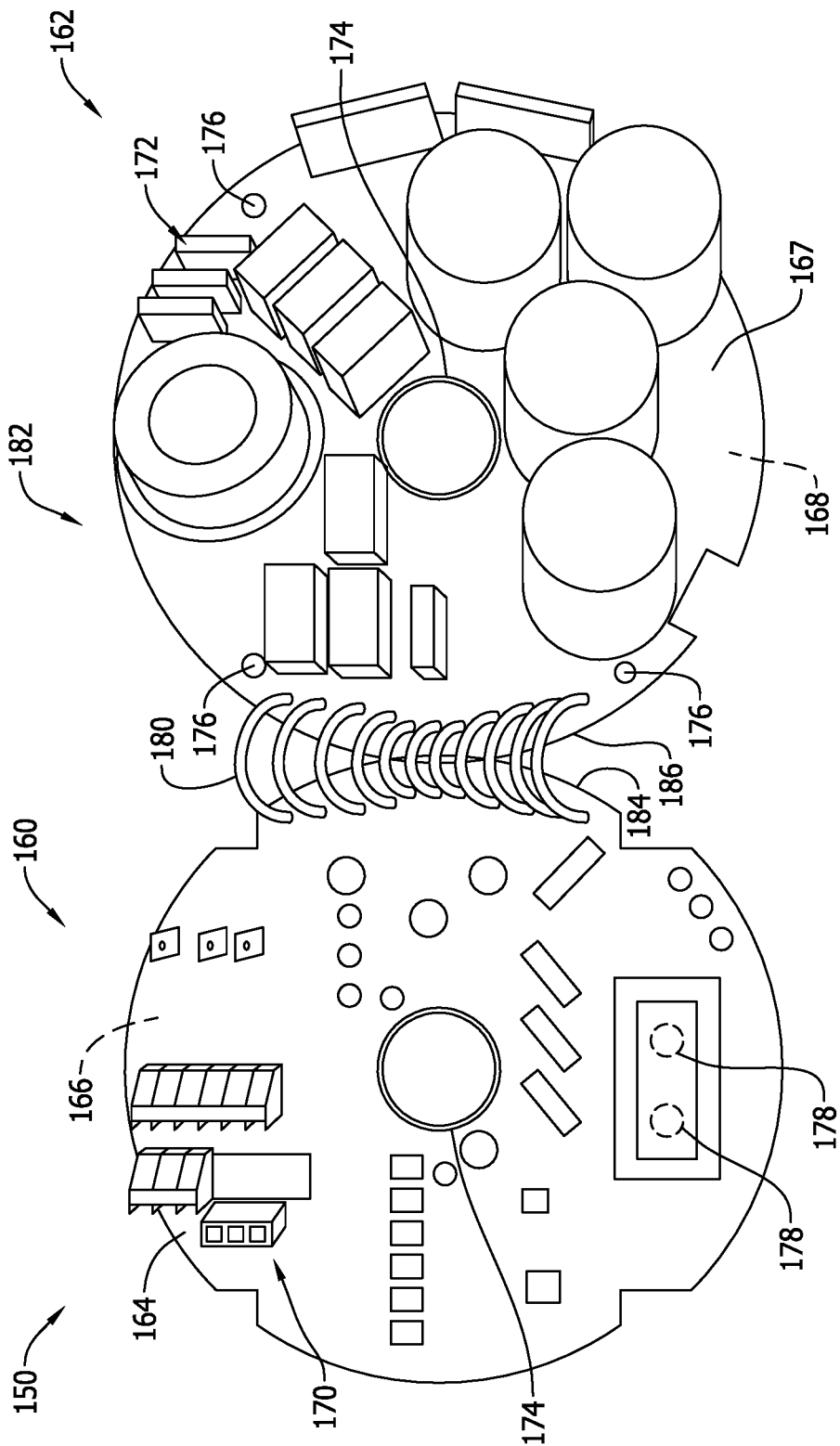
FIG. 4 is a top view of an exemplary circuit board, before encapsulation, of an exemplary motor controller that may be included within the motor and motor controller assembly shown in FIG. 3.
Figure 5:
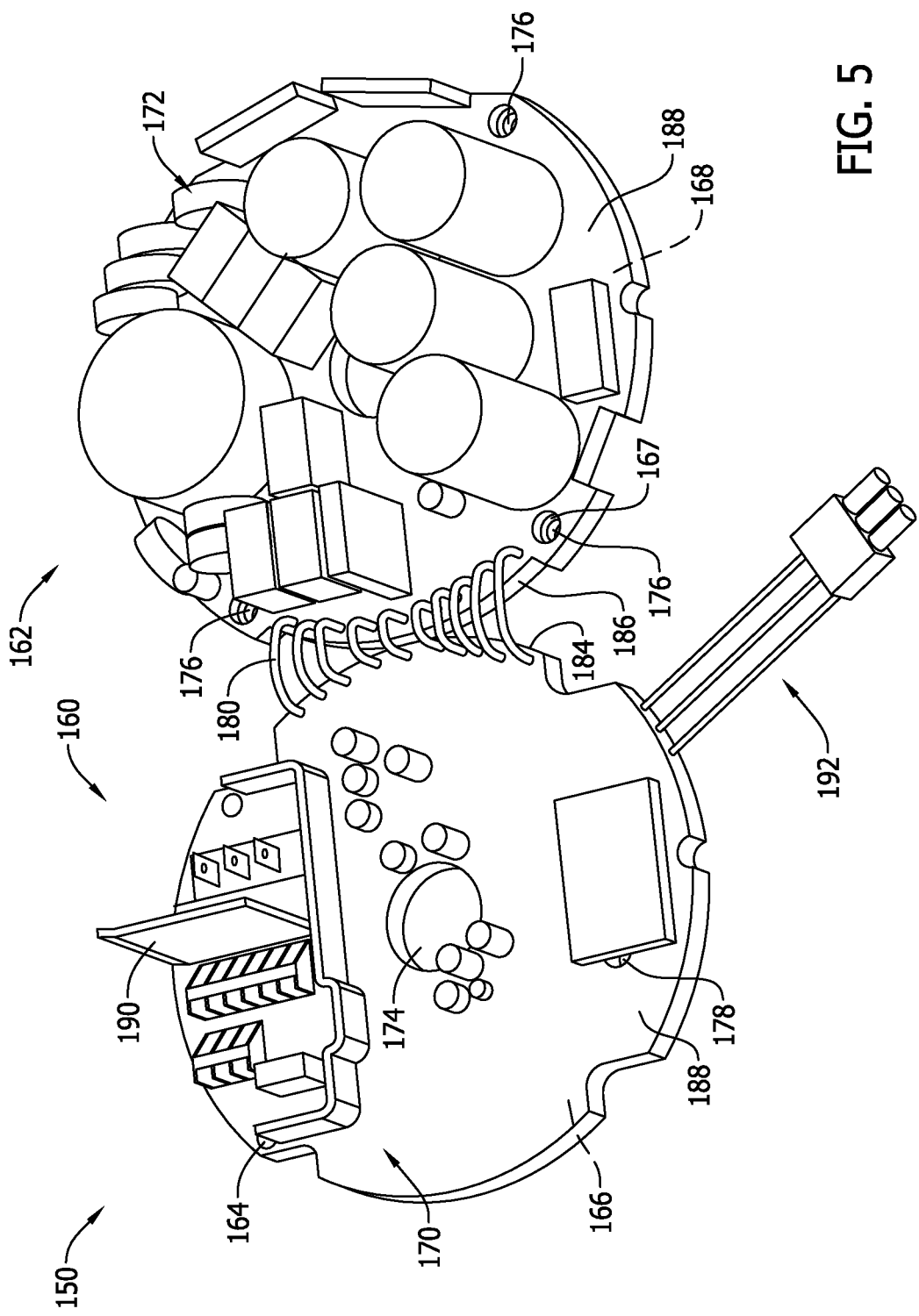
FIG. 5 is a perspective view of the circuit board shown in FIG. 4 after encapsulation.

FIG. 4 is a top view of an exemplary motor controller 150 before encapsulation with a potting material (not shown in FIG. 4). FIG. 5 is a perspective view of the motor controller 150 after encapsulation; Motor controller 150 that may be included within motor assembly 10 (shown in FIG. 1) and/or within motor assembly 100 (shown in FIG. 3). Motor controller 150 may be an ECM motor controller, for example, motor controller 104 (shown in FIG. 3), an induction motor controller, for example, motor controller 14 (shown in FIG. 1), or a motor controller configured to control any other type of electric motor. In the exemplary embodiment, motor controller 150 includes a first circuit board 160 and a second circuit board 162. First circuit board 160 includes a top surface 164, a bottom surface 166, and a first plurality of electrical components 170 coupled to top surface 164. Similarly, second circuit board 162 includes a top surface 167, a bottom surface 168, and a second plurality of electrical components 172 coupled to top surface 167.

Additionally, each circuit board 160 and 162 includes a central opening 174 and second circuit board 162 includes a plurality of mounting holes 176 configured to facilitate mounting motor control 150 to end cap 16. Moreover, first circuit board 160 also includes a plurality of component mounting openings 178 that facilitate mounting electrical components 172 to second circuit board 162.

In an exemplary embodiment, first circuit board 160 and second circuit board 162 are printed circuit boards that include leads and/or traces 174 that electrically couple electrical components 170 and electrical components 172 to form a circuit. As shown in FIG. 4, electrical components 170 are coupled to, and extend from, top surface 164 of first circuit board 160. Similarly, electrical components 172 are coupled to, and extend from, top surface 167 of second circuit board 162.

In the exemplary embodiment, electrical components 170 and 172 may include through-hole electrical components and/or surface-mount electrical components. In the exemplary embodiment, first circuit board 160 and second circuit board 162 are assembled from a single printed circuit board 182, which is divided to form first circuit board 160 and second circuit board 162 after components 170 are coupled to first circuit board 160 and components 172 are coupled to second circuit board 162. In an alternative embodiment, first circuit board 160 and second circuit board 162 are separate printed circuit boards while components 170 and 172 are attached thereto, respectively. Since first plurality of components 170 are coupled to top side 164 of first circuit board 160 and second plurality of components 172 are coupled to top side 167 of second circuit board 162, no components extend from bottom side 166 of first circuit board 160 or from bottom side 168 of second circuit board 162.

In the exemplary embodiment, first circuit board 160 and second circuit board 162 are electrically coupled using at least one lead 174. In the exemplary embodiment, the at least one lead 174 may include, but is not limited to, at least one conductive jumper wire and/or at least one conductive pin header. Electrical signals are transmitted between first circuit board 160 and second circuit board 162 through the at least one lead 174. In some embodiments, multiple jumper wires electrically couple leads included along an edge 184 of first circuit board 160 and leads included along an edge 186 of second circuit board 162. The jumper wires may be composed of any conductive material that allows motor controller 150 to function as described herein.

As shown in FIG. 5, after encapsulation, boards 160 and 162 include a layer of potting material 188. Specifically, first and second surfaces 164 and 166 of first circuit board 160 include a layer of potting material 188. More specifically, potting material layer 188 includes a first thickness on top surface 164 and a second thickness on bottom surface 166. In the exemplary embodiments the thicknesses of potting material 188 on surfaces 164 and 166 are substantially similar. More specifically, the minimum thickness of potting material 188 on surfaces 164 and 166 is within a range of at least between approximately 2 millimeters (mm.) and 4 mm. Similarly, potting material layer 188 includes a first thickness on top surface 167 of second circuit board 162 and a second thickness on bottom surface 168. In the exemplary embodiments the minimum thicknesses of potting material 188 on surfaces 167 and 168 are substantially similar. More specifically, the thickness of potting material 188 on surfaces 167 and 168 is within a range of at least between approximately 2 millimeters (mm.) and 4 mm.

In the exemplary embodiment, potting material 188 completely covers some electrical components 170 and 172 on first and second circuit boards 160 and 162, while only partially covering other electrical components 170 and 172 on first and second circuit boards 160 and 162. Additionally, first circuit board 160 includes a separator insert 190 coupled thereto. Separator insert 190 is coupled to top surface 164 of first circuit board 160 prior to potting material 188 such that potting material secures separator insert 190 in position. Separator insert 190 is coupled to first circuit board 160 as an isolation structure to physically separate some electrical components 170 from other electrical components 170.

Figure 6:
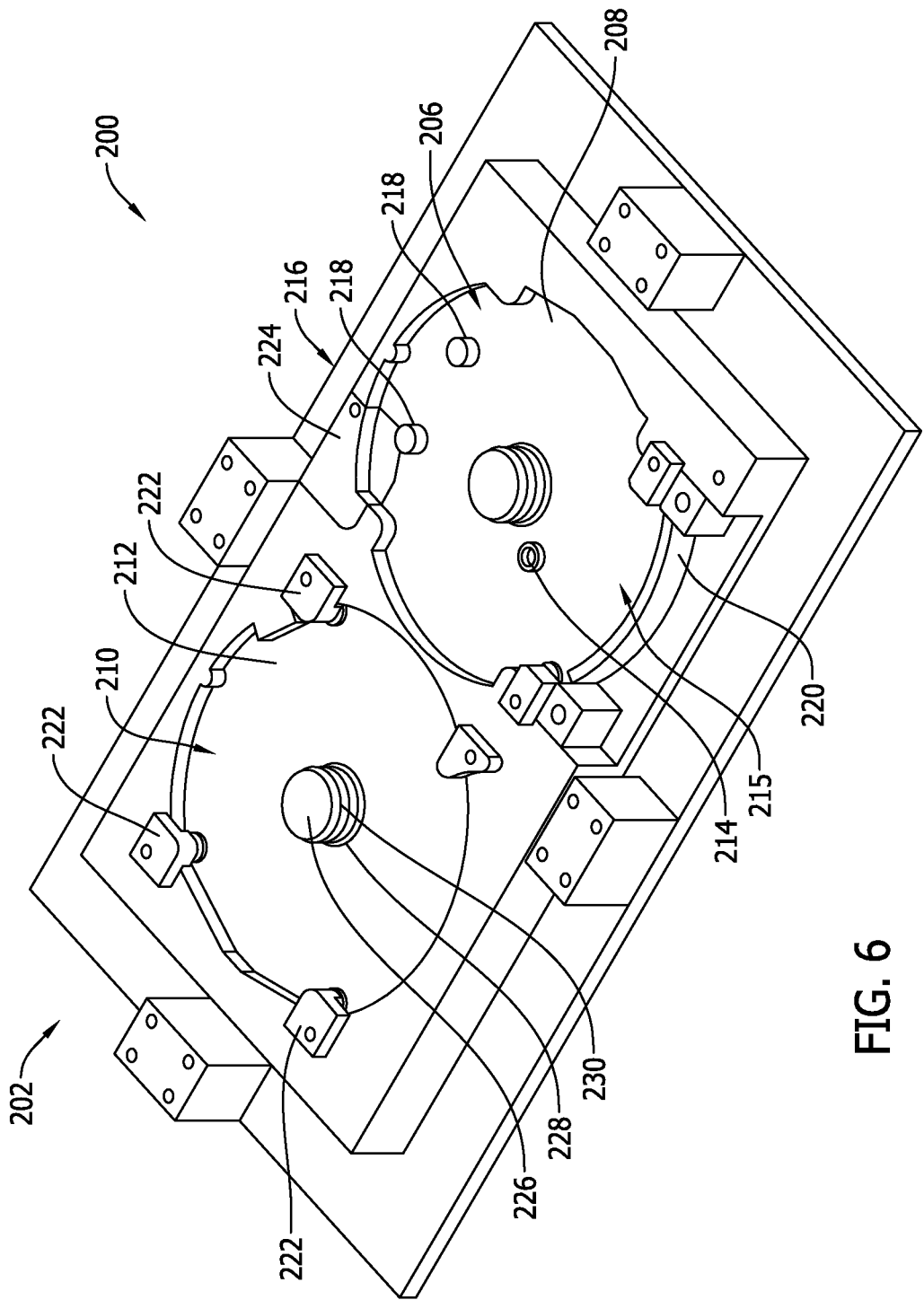
FIG. 6 is a perspective view of a base portion of an exemplary encapsulation mold assembly.
Figure 7:
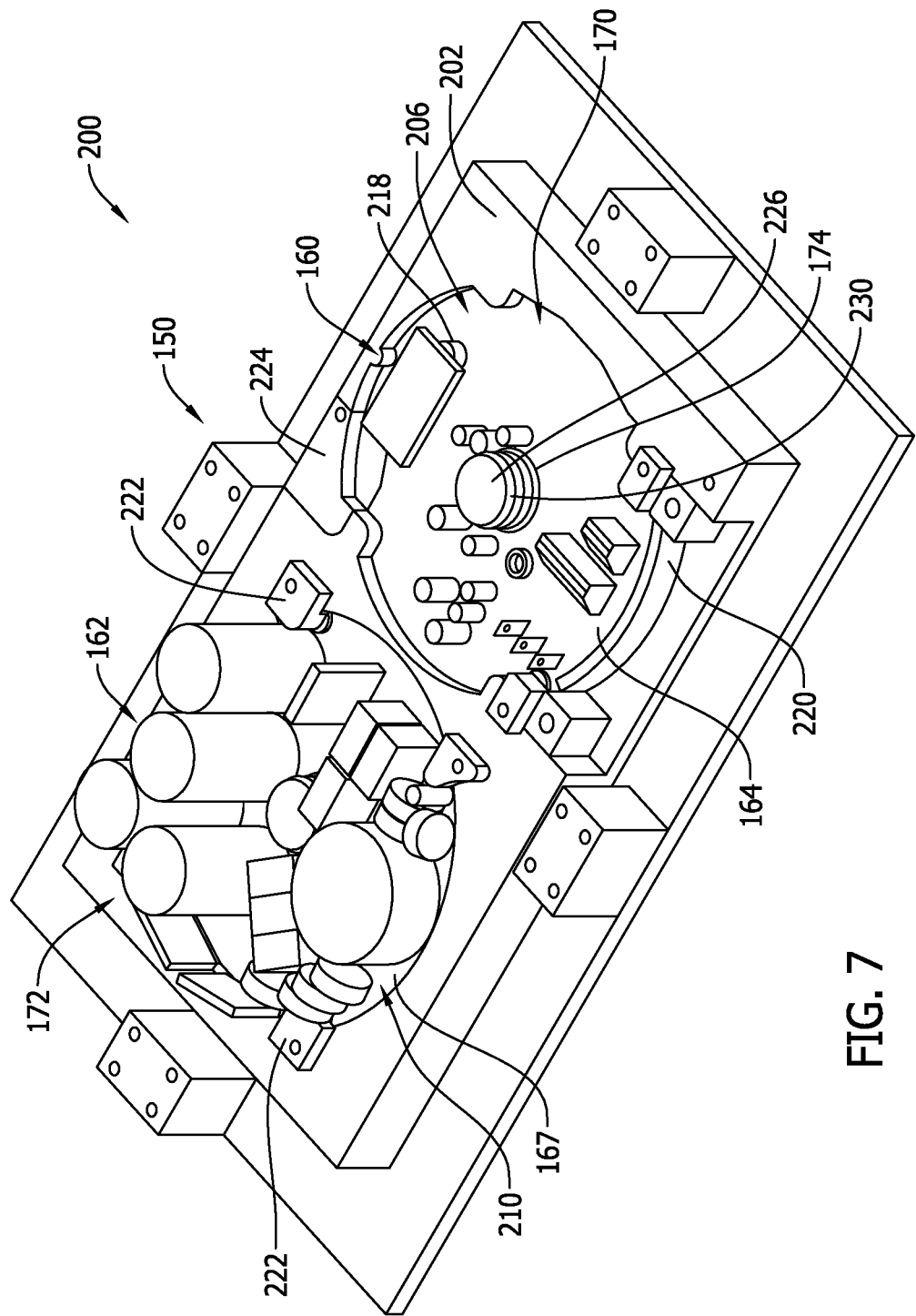
FIG. 7 is a perspective view of the base portion of the encapsulation mold assembly with the circuit board shown in FIG. 4.
Figure 8:
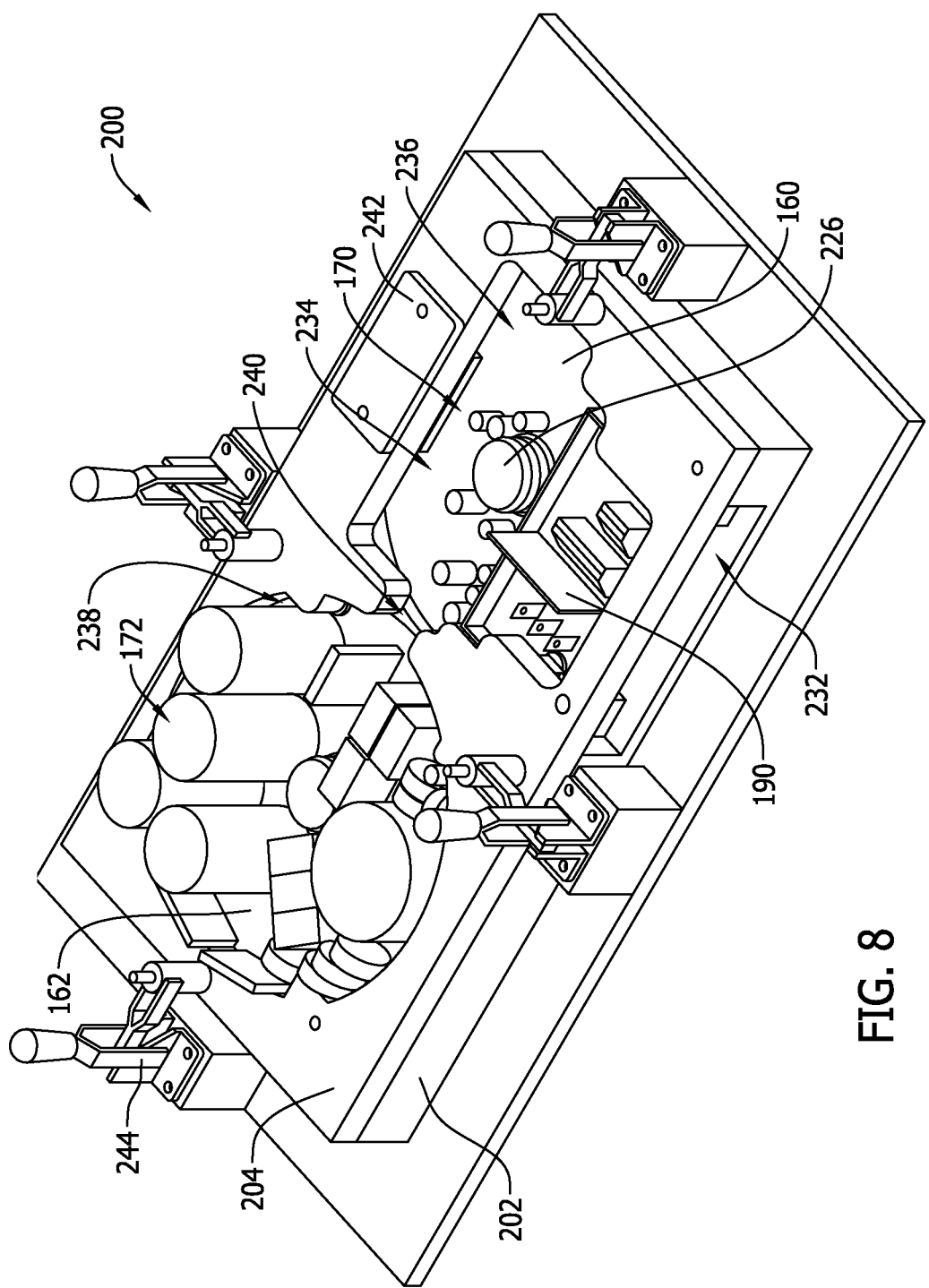
FIG. 8 is a perspective view of the assembled encapsulation mold assembly illustrating the base portion, an exemplary cover portion, and the circuit board.

FIG. 6 is a perspective view of an exemplary encapsulation mold assembly 200 illustrating a base portion 202 of encapsulation mold assembly 200. FIG. 7 is a perspective view of base portion 202 of encapsulation mold assembly 200 illustrating first and second printed circuit boards 160 and 162. FIG. 8 is a perspective view of the assembled encapsulation mold assembly 200 illustrating base portion 202, an exemplary cover portion 204, and first and second printed circuit boards 160 and 162.

In the exemplary embodiment, base portion 202 includes a first recess 206 having a first recess surface 208 and a second recess 210 having a second recess surface 212. Although described herein as including a plurality of recesses, it is contemplated that base portion 202 may include only a single recess. First recess 206 is configured to receive first circuit board 160 inserted therein such that first recess surface 208 is spaced from bottom surface 166 of first circuit board 160. Similarly, second recess 210 is configured to receive second circuit board 162 inserted therein such that second recess surface 212 is spaced from bottom surface 168 of second circuit board 162. More specifically, base portion 202 includes at least one spacer 214 positioned in at least one of recesses 206 and 210 and configured to define a gap 215 between bottom surfaces 166 and 168 and recess surfaces 208 and 212. As described herein, the gap 215 is filled with potting material 188 to capsulate printed circuit boards 160 and 162 in a layer of potting material 188 having a predetermined thickness. For example, spacer 214 spaces bottom surfaces bottom surfaces 166 and 168 from recess surfaces 208 and 212 a distance of at least approximately 2 mm. and 4 mm. to define the gap 215, which is filled with potting material 188 to form a layer of potting material 188 on bottom surfaces 166 and 168 having the same thickness as the gap distance (within a range of at least between approximately 2 mm. and 4 mm.) Although only a single spacer 214 is shown in FIG. 6 positioned in first recess 206, it is contemplated that, in the exemplary embodiment, each of first recess 206 and second recess 210 include a plurality of spacers 214 that define gaps 215 between bottom surfaces 166 and 168 and recess surfaces 208 and 212.

In the exemplary embodiment, encapsulation mold assembly 200 includes a plurality of isolation structures 216 that are coupled to base portion 202 and to cover portion 204 to prevent potting material 188 from contacting a plurality of predetermined portions of circuit boards 160 and 162. Isolation structures 216 include a plurality of isolation posts 218 coupled to and extending away from first recess surface 208. Isolation posts 218 are configured for insertion into electrical component mounting openings 178 when first circuit board 160 is inserted into first recess 206 to prevent potting material 188 from blocking component mounting openings 178.

Another isolation structure 216 coupled to encapsulation mold assembly 200 is an isolation barrier 220 coupled to base portion 202 proximate first recess 206. In the exemplary embodiment, isolation barrier 220 includes a plurality of components positioned coupled together to define a boundary perimeter of potting material 188 on first circuit board 160. Alternatively, isolation barrier 220 includes a single component coupled to base portion 202. Isolation barrier 220 forms a barrier for potting material 188 proximate separator insert 190 when first circuit board 160 is inserted into base portion 202.

Similar to isolation posts 218, base portion 202 also includes, as an isolation structure, a plurality of base isolation inserts 222 coupled to base portion 202. Specifically, in the exemplary embodiment, base isolation inserts 222 are coupled to second recess 210 of base portion 202 after second circuit board 162 is inserted into base portion 202. More specifically, base isolation inserts 222 are inserted into mounting holes 176 of second circuit board 162 before potting material 188 is injected into encapsulation assembly 200 to prevent potting material 188 from blocking mounting holes 176. Although base isolation inserts 222 are described herein as being inserted into mounting holes 176 after second circuit board 162 is coupled to base portion 202, it is contemplated that base isolation inserts 222 may be configured similar to isolation posts 218 and extend outward from recess surface 212. As described herein, base isolation inserts 222 are removable from base portion 202 after potting material 188 is injected.

Another example of an isolation structure 216 is a lead insert 224 that is coupled to base portion 202. More specifically, lead insert 224 forms a portion of recess 206 and coupled to base portion 202 before potting material 188 is injected. Lead insert 224 makes up a portion of base portion 202 to prevent potting material 188 from occupying a predetermined area of gap 215 to facilitate coupling a plurality of leads 192 (shown in FIG. 5) to first circuit board 162. As described herein, lead insert 224 is removable from base portion 202 after potting material 188 is injected.

In the exemplary embodiment, base portion 202 includes at least one guide post 226 extending from recess surfaces 212 and 208. More specifically, each recess 206 and 210 includes a guide post 226 extending from a center of a respective recess surface 208 and 212. Guide posts 226 facilitate aligning circuit boards 160 and 162 with their associated recesses 206 and 210 of base portion 202. More specifically, guide posts 226 are configured for insertion into central openings 174 of circuit boards 160 and 162. In one embodiment, guide posts 226 include a spacer rim 228 positioned a predetermined distance from a respective recess surface 208 and 212 such that spacer rim spaces bottom surfaces 166 and 168 of circuit boards 160 and 162 a predetermined distanced from recess surfaces 208 and 212 to define the gap 215 therebetween. Spacer rim 228 and spacer 214 may be used alone or in combination to define gap 215 for potting material 188. In the exemplary embodiment, guide posts 224 also include a fill guide 230 formed at a predetermined location on guide posts 226. Fill guide 230 indicates to a technician a fill level or thickness layer of potting material 188 on circuit boards 160 and 162. More specifically, fill guide 230 is located on guide posts 226 such that a predetermined distance is defined between fill guide 230 and top surfaces 164 and 167 of circuit boards 160 and 162. In such a configuration, the predetermined distance represents a thickness of a layer of potting material 188 on top surfaces 164 and 167. For example, fill guides 230 of guide posts 226 are spaced from top surfaces 164 and 167 of circuit boards 160 and 162 a distance of at least approximately 2 mm. and 4 mm. to define a thickness of the layer of potting material 188 on top surfaces 164 and 167. As such, during injection of potting material, fill guides 230 indicate to a technician when the layer of potting material 188 are reached a desired thickness on top surfaces 164 and 167.

In the exemplary embodiment, encapsulation mold assembly 200 includes cover portion 204 coupled to base portion 202 such that base portion 202 and cover portion 204 define a cavity 232 therebetween that receives first and second circuit boards 160 and 162 of motor controller 150. As shown in FIG. 8, cover portion 204 includes at least one injection port 234 defined therein through which potting material 188 is injected to form a layer of potting material 188 on first and second circuit boards 160 and 162. In the exemplary embodiment, injection port 234 includes a central opening that includes a first portion 236 and a second portion 238 that are formed as a single opening 234 including a bridge gap 240 between portions 236 and 238.

First portion 236 is associated with first circuit board 160 and generally positioned above first recess 206, second portion 238 is associated with second circuit board 162 and generally positioned above second recess 210, and bridge gap 240 is positioned above a portion of base portion 202 between recesses 206 and 210. More specifically, bridge gap 240 enables cover portion 204 to be positioned over motor controller 150 with leads 180 extending between first and second circuit boards 160 and 162. Furthermore, central opening 234 facilitates any height of electrical components 170 and 172 to be used on first and second circuit boards 160 and 162 and also allows a technician to visually engage fill guides 230 on guide posts 226 to determine when the layer of potting material 188 has reached a predetermined thickness on first and second circuit boards 160 and 162.

Although injection port 234 is described in the exemplary embodiment as a central opening defined in cover portion 204, in other embodiments, cover portion 204 does not include a large central opening as shown in FIG. 8. Alternatively, cover portion 204 includes one or more smaller injection ports 234 that may be defined in the top wall or a side wall of cover portion 204. Further, in some embodiment, base portion 202 also includes at least one injection port 234 defined therein. Generally, injection ports 234 are defined in base portion 202 and/or cover portion 204 to facilitate injection of the potting material into cavity 232.

Cover portion 204 also includes a cover isolation insert 242 that is coupled to cover portion 204. More specifically, cover isolation insert 242 is inserted into an insert opening defined in cover portion. In the exemplary embodiment, the insert opening is defined as a portion of central opening 234. In operation, cover isolation insert 242 contacts and surrounds at least one electrical component 170 or 172 to prevent potting material 188 from covering the electrical component 170 or 172. In one embodiment, cover isolation insert 242 allows a layer of potting material 188 to be formed around the electrical component 170 or 172 that is thinner than the remainder of the layer of potting material 188. In another embodiment, cover isolation insert 242 prevents potting material 188 from coating the electrical component 170 or 172 above which cover isolation insert 242 is positioned.

In operation, motor controller 150 is inserted into base portion 202 of encapsulation mold assembly 200. More specifically, first circuit board 160 is inserted into first recess 206 and second circuit board 162 is inserted into second recess 210. Inserted circuit boards 160 and 162 includes contacting bottom surfaces 166 and 168 to spacer 214 such that circuit boards 160 and 162 are spaced from surfaces 208 and 212 of recess 206 and 210 to define gap 215 between recess surfaces 208 and 212 and bottom surfaces 166 and 168. Additionally, inserting circuit board 160 includes aligning isolation posts 218 of base portion 202 with component mounting opening 178 and aligning guide posts 226 with central openings 174 of circuit boards 160 and 162.

Once circuit boards 160 and 162 are inserted into and coupled to base portion 202, base isolation inserts 222 are coupled to base portion 202 such that base isolation inserts 222 contact top surface 167 of second circuit board 162 proximate mounting holes 176 to isolate the area around mounting holes 176. Although described herein as being coupled to base portion 202, base isolation inserts 222 may be coupled to cover portion 204. Furthermore, separator insert 190 is coupled to first circuit board 160. Additionally, isolation barrier 220 is coupled to base portion 202. Alternatively, isolation barrier 220 may be coupled to base portion 202 before circuit boards 160 and 162 are coupled to base portion 202. As described herein, base isolation inserts 222, separator insert 190, and isolation barrier 220 are isolation structures 216 that prevent potting material 188 from bonding to circuit boards 160 and 162 in predetermined locations.

Cover portion 204 may then be coupled to base portion 202 such that circuit boards 160 and 162 are positioned within a cavity defined between base portion 202 and cover portion 204. In the exemplary embodiment, cover portion 204 includes a plurality of alignment openings (not shown) that are configured to receive a plurality of alignment pins (not shown) that extend from base portion 202 to align cover portion 204 with base portion 202. Alternatively, cover portion 204 may include the pins and base portion 202 may include the alignment openings. As described herein, cover portion 204 includes opening 234 that enables access to circuit boards 160 and 162 through cover portion 204. When cover portion 204 is in place above base portion 202, cover isolation insert 242 is coupled to cover portion 204 to occupy a portion of opening 234 such that cover isolation insert 242 also prevents potting material 188 from bonding to circuit boards 160 and 162 and/or electrical components 170 and 172 in predetermined locations. In the exemplary embodiment, cover portion 204 is secured to base portion 202 using a plurality of clamps 244. Alternatively, cover portion 204 may be secured to base portion 202 using any known securing method, such as, but not limited to, removable fasteners or vacuum bagging.

In the exemplary embodiment, when cover portion 204 is secured to base portion 202, potting material 188 may then be injected into the cavity 232 between cover portion 204 and base portion 202 through injection port 234 such that circuit boards 160 and 162 are at least partially coated in potting material 188. When injecting potting material 188 through injection port 234, potting material 188 is channeled within cavity such that potting material 188 is channeled into recesses 206 and 210 and forms a layer of potting material on bottom surfaces 166 and 168 having a predetermined thickness equal to the distance bottom surfaces 166 and 168 are spaced from recess surfaces 208 and 212. Once recesses 206 and 210 are filled, potting material 188 forms a layer on top surfaces 164 and 167. The technician uses fill guide 230 as a guide to indicate when the layer of potting material has reached a predetermined thickness on top surfaces 164 and 167. As described above, in the exemplary embodiment, the minimum thickness of potting material 188 on each of top surfaces 164 and 167 and bottom surfaces 166 and 167 is within a range of between approximately 2.0 mm. and 4.0 mm. Alternatively, potting material 188 layer includes any thickness that facilitates operation of motor controller 150 and encapsulation mold assembly 200 as described herein.

Although injection port 234 is described in the exemplary embodiment as a large central opening defined in cover portion 204, in other embodiments, potting material 188 is injected through at least one injection port 234 defined in either or both of base portion 202 and cover portion 204.

The apparatus and method herein describe a motor controller including a layer of potting material that has a predetermined thickness to provide a significant increase in environmental protection over conformal coating protection methods, while also reducing the amount of potting material required compared to known brick encapsulation methods. The method allows an existing motor controller to be potted, with a predefined potting thickness, on both top and bottom, without the need to completely encapsulate the motor controller board within the housing. This provides a substantial reduction in potting material used while also providing the desired level of environmental protection. Additionally, both manufacturing and labor costs and time are reduced because of using less material and because no modifications to the housing are required. Moreover, the apparatus and method described herein provide vibration protection via encapsulation and also provide isolation to various components requiring heat sinking.

Exemplary embodiments of an encapsulation mold assembly for forming a layer of potting material on a motor controller are described above in detail. The encapsulation mold assembly and motor controller and their components are not limited to the specific embodiments described herein, but rather, components of the systems may be utilized independently and separately from other components described herein. For example, the encapsulation mold assembly may also be used in combination with other machine systems, methods, and apparatuses, and are not limited to practice with only the motor controller as described herein. Rather, the exemplary embodiments can be implemented and utilized in connection with many other applications.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of encapsulating a printed circuit board of a motor controller with a potting material, said method comprising:
    inserting the printed circuit board into a recess formed in a base portion of an encapsulation assembly such that a bottom surface of the printed circuit board is spaced from a surface of the recess;
    coupling a cover portion of the encapsulation assembly to the base portion to define a cavity therebetween;
    injecting the potting material into the cavity through at least one injection port defined in at least one of the base portion and the cover portion such that the printed circuit board is at least partially coated in the potting material; and
    coupling a plurality of isolation structures to at least one of said base portion and said cover portion, wherein the plurality of isolation structures prevent the potting material from contacting a plurality of predetermined portions of the printed circuit board.

2. The method in accordance with claim 1, wherein inserting the printed circuit board comprises contacting the bottom surface of the printed circuit board to a spacer positioned in the recess to define a gap between the bottom surface and the recess surface.

3. The method in accordance with claim 1, wherein inserting the printed circuit board comprises aligning at least one isolation post of the base portion with at least one opening defined through the printed circuit board.

4. The method in accordance with claim 1, wherein coupling a plurality of isolation structures comprises inserting at least one base isolation insert into at least one mounting hole defined in the printed circuit board.

5. The method in accordance with claim 1, wherein coupling a plurality of isolation structures comprises coupling at least one isolation barrier to the base portion to define a boundary perimeter of the potting material.

6. The method in accordance with claim 1, further comprising coupling a separator insert to the printed circuit board to separate a plurality of electrical components of the printed circuit board.

7. The method in accordance with claim 1, wherein coupling the cover portion includes inserting at least one cover isolation insert into an insert opening defined in the cover portion.

8. The method in accordance with claim 1, wherein injecting the potting material includes prefilling the recess with the potting material before inserting the printed circuit board.

9. The method in accordance with claim 1, wherein injecting the potting material includes injecting the potting material through the at least one injection port onto a top surface of the printed circuit board such that the potting material is channeled into the recess.

10. An encapsulation assembly for use in coating a printed circuit board of a motor controller with a potting material, said encapsulation comprising:
    a base portion comprising at least one recess defined therein, wherein said at least one recess comprises a recess surface configured to be spaced from a bottom surface of the printed circuit board;

a cover portion configured to be coupled to said base portion such that said base portion and said cover portion define a cavity therebetween configured to receive the printed circuit board therein;

at least one injection port defined in at least one of said base portion and said cover portion, wherein said at least one injection port facilitates injection of the potting material into said cavity; and a plurality of isolation structures coupled to at least one of said base portion and said cover portion, wherein said isolation structures prevent the potting material from contacting a plurality of predetermined portions of the printed circuit board.

11. The encapsulation assembly in accordance with claim 10, wherein said base portion comprises a spacer positioned in said at least one recess to define a gap between the bottom surface and said recess surface.

12. The encapsulation assembly in accordance with claim 10, wherein said plurality of isolation structures comprises at least one isolation post coupled to and extending away from said recess surface, said at least one isolation post configured for insertion into at least one opening defined through the printed circuit board.

13. The encapsulation assembly in accordance with claim 10, wherein said plurality of isolation structures comprises at least one isolation barrier coupled to said base portion, said at least one isolation barrier configured to define a boundary perimeter of the potting material in said base portion.

14. The encapsulation assembly in accordance with claim 10, wherein said plurality of isolation structures comprises at least one base isolation insert configured to be coupled to said base portion, wherein said at least one base isolation insert is configured for insertion into at least one mounting hole in the printed circuit board.

15. The encapsulation assembly in accordance with claim 10, wherein said plurality of isolation structures comprises at least one cover isolation insert configured to be coupled to said cover portion, wherein said at least one cover isolation insert is configured for insertion into a portion of an insert opening defined in the cover portion.

16. The encapsulation assembly in accordance with claim 10, wherein said plurality of isolation structures comprises a separator insert configured to be coupled to the printed circuit board, wherein said separator insert is configured to separate a plurality of electrical components on the printed circuit board.

17. The encapsulation assembly in accordance with claim 10, wherein said base portion comprises a fill guide configured to indicate a predetermined thickness of the potting material on the printed circuit board.

18. A method of encapsulating a printed circuit board of a motor controller with a potting material, said method comprising:

inserting the printed circuit board into a recess formed in a base portion of an encapsulation assembly such that a bottom surface of the printed circuit board is spaced from a surface of the recess, wherein inserting the printed circuit board comprises aligning at least one isolation post of the base portion with at least one opening defined through the printed circuit board;

coupling a cover portion of the encapsulation assembly to the base portion to define a cavity therebetween; and injecting the potting material into the cavity through at least one injection port defined in at least one of the base portion and the cover portion such that the printed circuit board is at least partially coated in the potting material.

19. A method of encapsulating a printed circuit board of a motor controller with a potting material, said method comprising:

inserting the printed circuit board into a recess formed in a base portion of an encapsulation assembly such that a bottom surface of the printed circuit board is spaced from a surface of the recess;

inserting at least one base isolation insert into at least one mounting hole defined in the printed circuit board;

coupling a cover portion of the encapsulation assembly to the base portion to define a cavity therebetween; and injecting the potting material into the cavity through at least one injection port defined in at least one of the base portion and the cover portion such that the printed circuit board is at least partially coated in the potting material.

20. A method of encapsulating a printed circuit board of a motor controller with a potting material, said method comprising:

inserting the printed circuit board into a recess formed in a base portion of an encapsulation assembly such that a bottom surface of the printed circuit board is spaced from a surface of the recess;

coupling a cover portion of the encapsulation assembly to the base portion to define a cavity therebetween, wherein coupling the cover portion includes inserting at least one cover isolation insert into an insert opening defined in the cover portion; and injecting the potting material into the cavity through at least one injection port defined in at least one of the base portion and the cover portion such that the printed circuit board is at least partially coated in the potting material.

* * * * *